United States Patent
Kund et al.

(10) Patent No.: US 7,457,145 B2
(45) Date of Patent: Nov. 25, 2008

(54) WRITE/DELETE PROCESS FOR RESISTIVE SWITCHING MEMORY COMPONENTS

(75) Inventors: Michael Kund, Tuntenhausen (DE); Thomas Happ, Pleasantville, NY (US)

(73) Assignee: Infineon Technologies AG, Munich (DE)

( * ) Notice: Subject to any disclaimer, the term of this patent is extended or adjusted under 35 U.S.C. 154(b) by 35 days.

(21) Appl. No.: 11/092,969

(22) Filed: Mar. 30, 2005

(65) Prior Publication Data
US 2005/0232014 A1    Oct. 20, 2005

(30) Foreign Application Priority Data
Mar. 31, 2004    (DE) ............... 10 2004 015 928

(51) Int. Cl.
*G11C 11/00* (2006.01)
(52) U.S. Cl. ................................ 365/148; 365/163
(58) Field of Classification Search .............. 365/100, 365/148, 163
See application file for complete search history.

(56) References Cited

U.S. PATENT DOCUMENTS

| | | | |
|---|---|---|---|
| 3,827,033 A * | 7/1974 | Quilliam ............... 365/163 |
| 4,357,685 A * | 11/1982 | Daniele et al. .......... 365/185.19 |
| 5,200,920 A * | 4/1993 | Norman et al. ........ 365/185.19 |
| 5,627,784 A * | 5/1997 | Roohparvar ........... 365/189.01 |
| 5,873,113 A * | 2/1999 | Rezvani ................... 711/103 |
| 6,256,247 B1 * | 7/2001 | Perner ...................... 365/209 |
| 6,456,525 B1 * | 9/2002 | Perner et al. ............. 365/171 |
| 6,504,750 B1 * | 1/2003 | Baker ....................... 365/148 |
| 6,625,054 B2 * | 9/2003 | Lowrey et al. ........... 365/148 |
| 6,700,818 B2 * | 3/2004 | Shappir et al. ......... 365/185.19 |
| 6,950,331 B2 * | 9/2005 | Yang et al. ............... 365/148 |
| 7,190,620 B2 * | 3/2007 | Maayan et al. ......... 365/185.19 |

FOREIGN PATENT DOCUMENTS

EP    1308960 A2    5/2003

\* cited by examiner

*Primary Examiner*—Tan T. Nguyen
(74) *Attorney, Agent, or Firm*—Slater & Matsil, L.L.P.

(57) ABSTRACT

The invention relates to a system, a memory component and a process for operating a memory cell, which includes an active material, which can be changed into a more or less conductive state by an appropriate switching process, whereby the process including (a) bringing the memory cell into the more or less conductive state and evaluating the state of the memory cell after it has been changed into the more or less conductive state.

16 Claims, 3 Drawing Sheets

WRITE/DELETE PROCESS FOR RESISTIVE SWITCHING MEMORY COMPONENTS

CLAIM FOR PRIORITY

This application claims the benefit of priority to German Application No. 10 2004 015 928.9, filed Mar. 31, 2004, the contents of which are hereby incorporated by reference in its entirety.

TECHNICAL FIELD OF THE INVENTION

The invention relates to a process for operating a memory cell, as well as a memory component, in particular a resistive switching memory component, and a system with a similar memory component.

BACKGROUND OF THE INVENTION

With conventional semi-conductor memory components a distinction is made between so-called function memory components (i.e. PLAs, PALs, etc.), and so-called table memory components, i.e. ROM components (ROM=Read Only Memory), and/or non-volatile memories)—in particular PROMs, EPROMs, EEPROMs, flash memories, etc., and RAM-components (RAM=Random Access Memory and/or Read-write memories), for instance DRAMs and SRAMs.

A RAM component is a memory device in which data is stored under a specified address, from which address the data can later be read out again.

As a RAM component needs to accommodate as many memory cells as possible, it becomes important for this to be achieved as simply as possible.

With SRAMs (SRAM=Static Random Access Memory) for instance the individual memory cells consist of a few, for instance six transistors, and with so-called DRAMs (DRAM=Dynamic Random Access Memory) generally only of a single, appropriately controlled capacitive element (for instance a trench condenser), with the capacitance of which one bit at a time can be stored as a charge.

This charge only persists only for a very short time and therefore a so-called "refresh" needs to be performed, e.g., at an average of every 64 ms.

In contrast to this, no "refresh" needs to be performed on SRAMs; i.e. the data stored in the memory cell remains there for as long as a suitable supply voltage is supplied to the SRAM.

In contrast to this, the data stored in non-volatile memory components (NVMs and/or non-volatile memories), for instance EPROMs, EEPROMs and flash memories, remains intact even when the supply voltage is switched off.

Furthermore, so-called "resistive" and/or "resistive switching" memory components have—recently—also become known, for instance so-called phase change memories (Phase Change Memories), PMC memory (PMC=Programmable Metallization Cell), CB memories (CB=Conductive Bridging memories), etc.

With "resistive" and/or "resistive switching" memory components, an "active" material—for instance placed between two corresponding electrodes (i.e. a anode and a cathode)—is brought into a more or less conductive state by means of appropriate switching processes (more accurately: by means of appropriate current pulses of a corresponding height and duration). Here the more conductive state corresponds with a stored logic "one", and for instance the less conductive state with a stored logic "zero", or vice versa.

With phase change-memories (Phase Change Memories (PC memories)) the "active" material—connected between two corresponding electrodes—may for instance be a suitable chalcogen compound (for instance a Ge, Sb, Te or an Ag, In, Sb, Te compound).

The chalcogen compound material can be brought into an amorphous, i.e. a relatively poor conductive, or a crystalline, i.e. a relatively strong conductive state by means of appropriate switching processes (whereby for instance the relatively strong conductive state may be a stored logic "one", and the relatively weak conductive state a stored logic "zero" or vice versa).

Phase-change memory cells are for instance known from G. Wicker, *Nonvolatile, High Density, High Performance Phase Change Memory*, SPIE Conference on Electronics and Structures for MEMS, Vol. 3891, Queensland, 2, 1999, as well as for instance from Y. N. Hwang et. al., *Completely CMOS Compatible Phase Change Nonvolatile RAM Using NMOS Cell transistors*, IEEE Proceedings of the Nonvolatile Semiconductor Memory Workshop, Monterey, 91, 2003, S. Lai et. al., *OUM—A 180 nm nonvolatile memory cell element technology for stand alone and embedded applications*, IEDM 2001, etc.

When programming an appropriate PMC memory cell in the case of a PMC memory (PMC=Programmable Metallization Cell)—depending on whether a logic "one", or a logic "zero" is to be written into the cell—by means of appropriate current pulses of a corresponding height and duration, a corresponding metal "dendrite" (for instance of Ag, or Cu, etc.) is created by the electro-chemical reaction caused in an active material placed between two electrodes (which leads to a conductive state of the cell), or broken down (which leads to a non-conductive state of the cell).

PMC memory cells are for instance known from Y. Hirose, H. Hirose, *J. Appl. Phys.* 47, 2767 (1975), and for instance from M. N. Kozicki, M. Yun, L. Hilt, A. Singh, *Electrochemical Society Proc.*, Vol. 99-13, (1999) 298, M. N. Kozicki, M. Yun, S. J. Yang, J. P. Aberouette, J. P. Bird, *Superlattices and Microstructures*, Vol. 27, No. 5/6 (2000) 485-488, as well as for instance from M. N. Kozicki, M. Mitkova, J. Zhu, M. Park, C. Gopalan, "*Can Solid State Electrochemistry Eliminate the Memory Scaling Quandary?*", Proc. VLSI (2002), and R. Neale: "*Micron to look again at non-volatile amorphous memory*", Electronic Engineering Design (2002).

Furthermore so-called CB memories (CB=Conductive Bridging memories) are also known in state of the art technology.

CB memories are for instance described by Y. Hirose, H. Hirose, J. Appl. Phys. 47, 2767 (1975), T. Kawaguchi et. al., "*Optical, electrical and structural properties of amorphous Ag—Ge—S and Ag—Ge—Se films and comparison of photoinduced and thermally induced phenomena of both systems*", J. Appl. Phys. 79 (12), 9096, 1996, as well as for instance by M. Kawasaki, et. al., "*Ionic conductivity of $Ag_x(GeSe_3)_{1-x}$ ($0<x<0.571$) glasses*", Solid State Ionics 123, 1999, etc.

With CB memories, the switching process derives from the fact that when appropriate current pulses—of corresponding height and duration—are applied to an active material placed between two electrodes (for instance a suitable chalcogen (for instance GeSe, GeS, AgSe, CuS, etc.)) the elements of a corresponding precipitated "cluster" are made to increase in volume until the two electrodes are finally "bridged", i.e. they become conductively interconnected (with the CB cell being brought into a conductive state).

By applying appropriate inverted current pulses, this process can be reversed again, whereby the corresponding CB cell can be brought into a non-conductive state again.

What is problematic about "resistive switching" is that in such memories the resistance between the electrodes in a particular state of the cell (i.e. either "conductive", or "non-conductive") may vary relatively strongly.

This variation makes it difficult to evaluate the above states by means of an appropriate evaluation circuit (i.e. it becomes difficult to determine whether a logic "zero", or a logic "one" has previously been stored in the cell).

SUMMARY OF THE INVENTION

This invention provides a novel process for operating a memory cell, as well as a novel memory component, in particular a resistive switching memory component, and a system with a similar memory component.

In one embodiment of the invention, there is a process for operating a memory cell, which includes an active material, able to be changed into a more or less conductive state by means of an appropriate switching process. The process includes:
 (a) Placing the memory cell into the more or less conductive state;
 (b) Evaluating the state of the memory cell, after it has been placed in the more or less conductive state.

BRIEF DESCRIPTION OF THE DRAWINGS

The invention is described in more detail below with the use of several embodiment examples and the attached drawings. In the drawings.

DETAILED DESCRIPTION OF THE INVENTION

Figure 1:
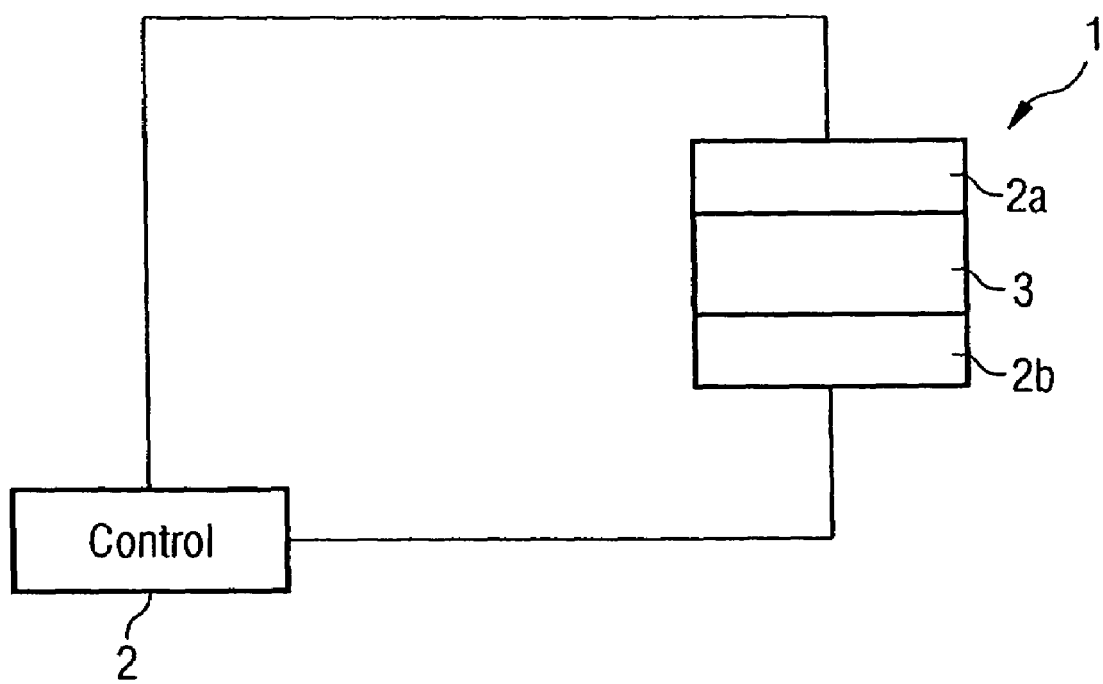
FIG. 1 shows an exemplary resistive switching memory cell, and a central control device connected thereto.

FIG. 1 includes—purely schematically and as an example—the construction of a resistive switching memory cell 1 and a central control device 2 connected to it.

Numerous further memory cells—constructed and operating in correspondingly similar or identical way to the memory cell 1 shown in Figure—may be arranged onto a corresponding memory component (for instance lying adjacent to each other—in a corresponding cell field—in several rows and/or columns).

As is more closely described below, a special write and/or delete process, in particular a special write and/or delete parameter adjustment process is performed—under control of the central control device 2 provided on the memory component—on several memory cells, in particular on all memory cells arranged in a corresponding cell field (and/or provided on the memory component)

As is apparent from FIG. 1, each of the above memory cells 1 contains two corresponding metal electrodes 2a, 2b (i.e. an anode and a cathode).

A layer 3 of an appropriate "active" material has been placed between the electrodes.

By means of appropriate switching processes (in particular by applying a corresponding current or voltage pulse of suitable height and duration)—for instance controlled by the central control device 2—the material layer 3 can be brought into a more or less conductive state (whereby for instance the more conductive state corresponds to a stored logic "one" and the less conductive state to a stored logic "zero", or vice versa).

The memory cells 1 may in principle be any type of resistive switching memory cell, in particular for instance phase change memory cells, CB memory cells (CB=Conductive Bridging), or PMC memory cells (PMC=Programmable Metallization Cell), etc.

Below—simply by way of an example—the functioning of phase change memory cells 1 is described:

With phase change memory cells 1 the "active" material used for the above material layer 3 may for instance be a suitable chalcogen compound (for instance a Ge—Sb—Te or an Ag—In—Sb—Te compound).

The chalcogen compound material can be brought into an amorphous, i.e. a relatively poorly conductive state, or into a crystalline, i.e. a relatively highly conductive state, for instance by means appropriate switching processes—for instance controlled by the central control device 2—(in particular by means of current pulses of an appropriate height and duration), whereby for instance the relatively highly conductive state may correspond with a stored logic "one", and the relatively poorly conductive state with a stored logic "zero", or vice versa).

A suitable metal and/or corresponding metal alloy can be used as material of the upper and/or lower electrodes 2a, 2b, for instance TiN, TiSiN, TiAlN, TaSiN, or TiW, etc., or for instance tungsten, or any other suitable electrode material.

In order to cause a change in the state of the memory cell 1 from an amorphous, i.e. a relatively weak conductive state of the "active" material, into a crystalline, i.e. a relatively strong conductive state, a corresponding current pulse—for instance controlled by the central control device 2—of corresponding height and duration can be applied to the electrodes 2a, 2b which, due to the relatively high resistance of the active material layer 3—causes the active material layer 3 to be correspondingly heated—to above the crystallization temperature of the active material—which causes a crystallization of the relevant areas of the active material layer 3 ("writing process").

On the other hand, a change in the state of the relevant areas of the active material layer 3 from a crystalline, i.e. a relatively strong conductive state, into an amorphous, i.e. a relatively weak conductive state, can for instance be achieved thereby that—again by applying a corresponding current pulses of appropriate height and duration (for instance controlled by the central control device 2) to the electrodes 2a, 2b—corresponding areas of the active material layer 3 are heated to above the melting point of the active material layer 3, to be subsequently "tempered" into an amorphous state by being rapidly cooled ("delete process").

If for instance a CB memory cell is used as the memory cell 1, the material used for the active material layer 3 may for instance be a corresponding chalcogen (for instance GeSe, GeS, AgSe, CuS, etc.) and—for one of the electrodes, for instance the electrode 2a—for instance Cu, Ag, Au, Zn, etc., and—for the other electrode 2b—for instance W, Ti, Ta, TiN, etc.

The switching process in CB memory cells 1 depends thereon that—by applying an appropriate current (or voltage pulse of a corresponding height and duration—corresponding (Cu—, Ag—, Au—, or Zn—, etc.) "clusters" of precipitates keep on increasing in volume in the active material layer 3, until the two electrodes 2a, 2b are finally conductively "bridged", i.e. they become conductively interconnected (the CB memory cell 1 is in a conductive state).

By applying suitably inverted current (and/or voltage pulses, this process can be reversed again, whereby the corresponding CB memory cell 1 is brought back into a non-conductive state again.

For optimizing and/or adjusting the parameters (for instance the duration and/or height of the write and/or delete current and/or voltage pulses, etc.) applied during the write (or delete) process, for instance the following process controlled by the central control device 2 can be used, as is more closely described in detail by means of FIG. 2 (below illustrated as an example for optimizing and/or adjusting the write parameters of phase change memory cells, or CB memory cells; a corresponding process can also be used for optimizing and/or adjusting the delete parameters, and/or for optimizing the write and/or delete parameters of any other "resistive switching" memory cells, for instance PMC memory cells, etc.):

In a first step A, the corresponding memory cell 1 (or alternatively numerous memory cells 1)—controlled by the central control device 2—is written with a corresponding data bit (for instance with a logic "one" (or a logic "zero")) i.e. brought from a relatively less conductive into a relatively more conductive state (or vice versa).

The write parameters (duration and height of the write pulses) used for this are set at a relatively low standard (initial) value, so that an excessively "hard" writing of the memory cell 1 is avoided (i.e. the corresponding memory cell 1 is given a relatively "soft" write (a "standard soft write")).

Figure 2:
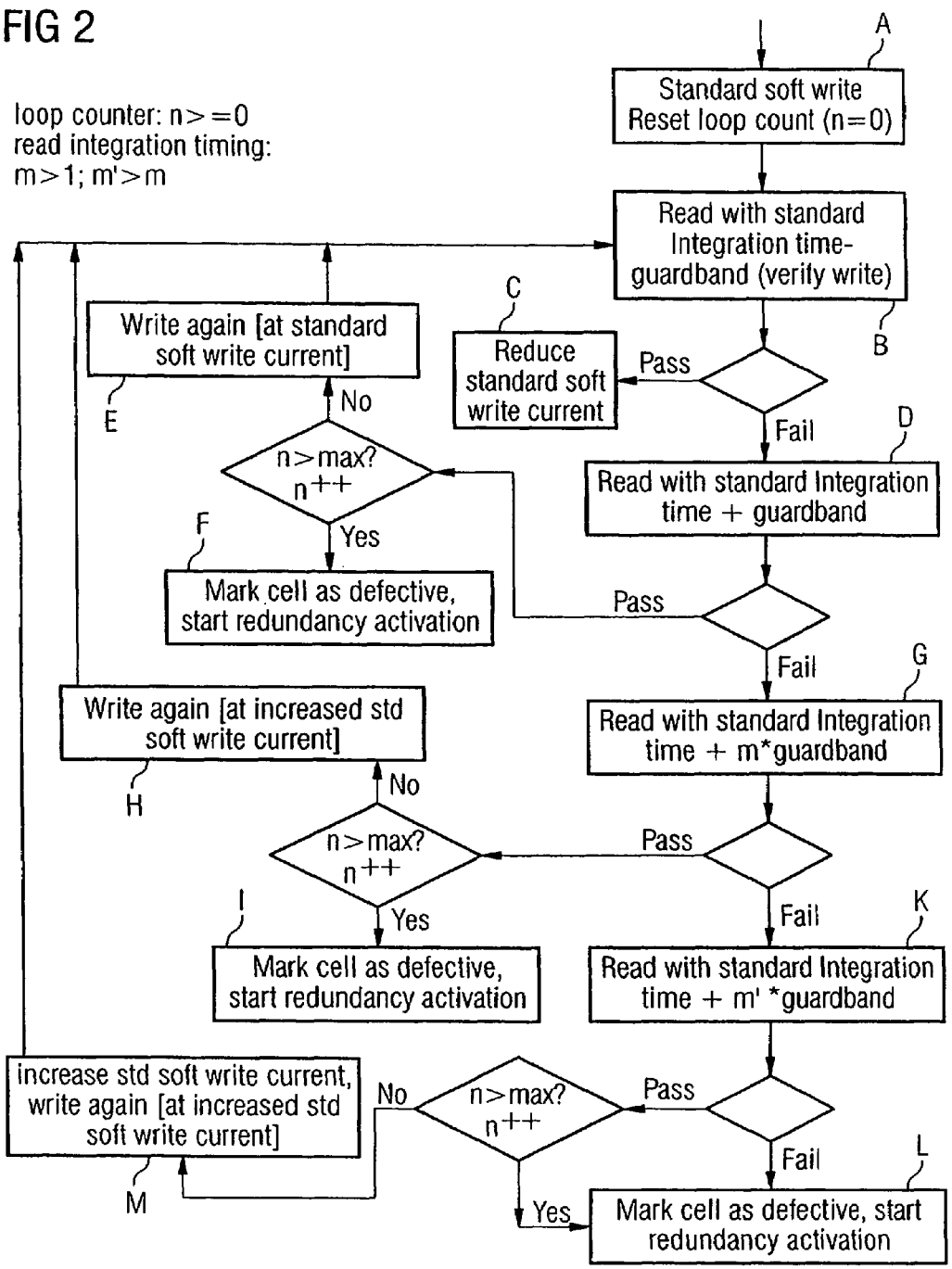
FIG. 2 shows a flow diagram to illustrate the write and/or delete process steps performed by a first embodiment of the invention.

Furthermore—as is also illustrated in FIG. 2—a loop number variable n is (re)set to the value "zero".

Next—as illustrated in FIG. 2—during a step B, and controlled by the central control device 2 (in particular by an evaluation circuit provided there) the data value written into the corresponding memory cell 1 is read out.

To achieve this the central control device 2 (in particular the evaluation circuit) can apply a corresponding voltage to the electrodes 2a, 2b of the memory cell 1.

The resulting current—flowing through the active material layer 3—is integrated by the central control device 2 (in particular by the evaluation circuit) during a predetermined time period (and in fact not during the whole standard integration period ("standard integration time" $t_{integration,standard}$)—used during the normal operation of conventional memory cells—but—simply—during the standard integration period ("standard integration time" $t_{integration,standard}$), minus a "safety margin" (i.e. minus a "guardband time" $t_{guardband}$) (i.e. during a time period $t_{integration,standard} - t_{guardband}$))

Depending on whether the value determined by the integration lies above or below a predetermined critical limit, it is decided whether the memory cell 1 was in a relatively high conductive or a relatively low conductive state (i.e., that the memory cell 1 had a logic "one", or logic "zero" data bit written into it).

Alternatively one could for instance also proceed correspondingly (with corresponding steps, for instance a step D, G, K, etc,—as shown in FIG. 2 and more closely described below—) as follows:

A suitable condenser—for instance one controlled by the central control device 2—is charged to a predetermined voltage, and then discharged via the memory cell 1, in fact—also—during a predetermined time period, in particular during the above time period $t_{guardband}$ which corresponds with the time period $_{integration,standard} - t_{guardband}$.

The voltage still present at the condenser—after this discharge time period—is then compared with a predetermined critical limit, correspondingly similar to the way described above.

Depending on whether—after the above discharge time period—the condenser voltage still present lies below or above the predetermined critical limit, it is assumed that the memory cell 1 was in a relatively high conductive, or a relatively low conductive state (i.e., that the memory cell 1 had a logic "one", or logic "zero" data bit written into it).

Then it is verified, according to FIG. 2, whether the data bit—determined during step B and read out from the memory cell 1—corresponds with the data unit written into the memory cell 1 during step A.

If "yes," the memory cell 1 is ready for a new action (write or delete action).

Furthermore—in terms of step C shown in FIG. 2—the write parameters used for future write actions into the memory cell 1 (and where needed into the above further memory cells) are reduced, i.e. either regarding the duration and/or the height of the write pulses, so that during future write actions the memory cell 1 (and where needed also the above further memory cells) are then written less "hard" than before, due to the reduced standard write parameters (i.e. the reduced duration and/or height of the write pulses).

If it is determined during the above step B that the data bit read out does not correspond with the data previously written into memory cell 1, in particular during step A, the data value written into the corresponding memory cell 1 is—as illustrated in FIG. 2—read out anew during a step D and controlled by the central control device 2 (in particular by the evaluation circuit provided there) as described below:

A corresponding voltage is applied anew by the central control device 2 (in particular by the evaluation circuit) to the electrodes 2a, 2b of the memory cell 1.

The resulting current—flowing through the active material layer 3—is integrated by the central control device 2 (in particular by the evaluation circuit), and in fact during an integration time period increased in relation to that in step B—(namely during a time period lying above the standard integration time period ("standard integration time" $t_{integration,standard}$) used during the normal operation of conventional memory cells (for instance above the standard integration time period ("standard integration time" $t_{integration,standard}$), plus the above "safety margin" (i.e. plus the "guardband time" $t_{guardband}$) (i.e. during a time period $t_{integration,standard} + t_{guardband}$))).

Depending on whether the value determined by integration lies above or below the above critical limit, it is assumed that the memory cell 1 was in a relatively strong conductive or a relatively weak conductive state (i.e., that the memory cell 1 had a logic "one", or logic "zero" data bit written into it).

Then it is verified whether the data—determined during step D and read out of the memory cell 1—corresponds with the data previously written into the memory cell 1.

If so, the current value of the loop count variable n—as illustrated in FIG. 2—is compared (by the central control device 2) with a predetermined variable maximum value $n_{max}$.

The variable maximum value $n_{max}$ may for instance amount to between 2 and 30, in particular for instance to between 8 and 20, etc.

In case the current value of the loop count variable n is smaller than or equal to the above variable maximum value $n_{max}$, the value of the loop count variable n—as per FIG. 2—is for instance increased by one (n++).

Then—as per the step E shown in FIG. 2—the corresponding memory cell 1 is written anew (corresponding with the above step A and controlled by the central control device 2) with the data bit corresponding with the previously written data bit (without first deleting the data bit formerly stored on the memory cell 1) for instance—in accordance with the previously performed step A, and with corresponding write parameters—with a logic "one" (or a logic "zero").

Next the data bit written into the memory cell 1 is read out again (corresponding with the above step B, and in particular by using an integration time period of $t_{integration,standard} - t_{guardband}$) and verified to see if it corresponds with the data bit previously written into the memory cell 1.

If so, the memory cell 1 is ready for a new (write or delete) action (alternatively and additionally—in accordance with that described for the above step C—the write parameters can be correspondingly adapted, in particular be reduced.)

If not—as also illustrated in FIG. 2—(corresponding with the above step D, and in particular by using an integration time period of $t_{integration,standard} + t_{guardband}$), the data written into the memory cell 1 is read out and verified to see whether it corresponds with the data previously written into the memory cell 1.

If so—as illustrated in FIG. 2—the current value of the loop count variable n is (again) compared (by means of the central control device 2) with the predetermined variable maximum value $n_{max}$.

If the current value of the of the loop count variable n is larger than the above variable maximum value $n_{max}$, it is assumed—as per FIG. 2 and the step F shown there—that the corresponding memory cell 1 is defective.

The memory cell 1 will then—in future—not be controlled (instead of this a redundant cell—functionally replacing the defective cell 1 and activated during step F—will be).

If it is determined—as also illustrated in FIG. 2—during the above step D, i.e. by using an integration time period of $t_{integration,standard} + t_{guardband}$ that the data bit read from the memory cell 1 does not correspond with the data previously written into the memory cell 1, the data value written into the corresponding memory cell 1, is—corresponding with the step G illustrated in FIG. 2 (and controlled by the central control device 2)—again read out as correspondingly described below:

After an appropriate voltage has been applied to the electrodes 2a, 2b of the memory cell 1, the resulting current—flowing through the active material layer 3—is integrated, and in fact—during an integration time period again increased in relation to step D (namely during a time period lying m times the "guardband time" $t_{guardband}$ above the standard integration time period ("standard integration time" $t_{integration,standard}$) (i.e. during a time period $t_{integration,standard} + m \times t_{guardband}$, whereby the following applies: m>1, in particular for instance m=2)).

Depending on whether the value determined by the above integration lies above or below the above predetermined critical limit, it is assumed that the memory cell 1 was in a relatively strong conductive or a relatively weak conductive state (i.e., that the memory cell 1 had a logic "one", or a logic "zero" written into it).

Then it is verified whether the data bit—determined during step G and read out of the memory cell 1—corresponds with the data bit written into the memory cell 1 during the last write step.

If so—as illustrated in FIG. 2—the current value of the loop count variable n is compared (by means of the central control device 2) with the predetermined variable maximum value $n_{max}$.

In case the current value of the loop count variable n is smaller than or equal to the above variable maximum value $n_{max}$, the value of the loop count variable n is—in accordance with FIG. 2—increased by one (n++).

Then—in accordance with step H illustrated in FIG. 2—as per the above steps A and E (and controlled by the central control device 2) the corresponding memory cell 1—again—has the corresponding data written into it (for instance—again—a logic "one" (or a logic "zero")).

This is done by using write parameters—increased in relation to the standard write parameters used previously—(i.e., the corresponding write pulse is longer and/or higher than the write pulse used previously).

This raising does not apply "globally", but only to the process step H—repeated several times if needed—illustrated in FIG. 2 (i.e. the standard write parameters remain—for the time being—unchanged).

Next (in accordance with the above step B, and in particular by using an integration time period of $t_{integration,standard} - t_{guardband}$) the data written into the memory cell 1 is read out again and verified, to see whether it corresponds with the data previously written into the memory cell 1.

If so, the memory cell 1 is prepared for a new (write or delete) action; (alternatively and additionally, the write parameters can—corresponding with step C described above—be correspondingly adjusted, in particular reduced).

If not, the data written into the memory cell—as is also shown in FIG. 2—can be read out (in accordance with the above step D, and in particular by (again) using an integration time period of $t_{integration,standard} + t_{guardband}$), and verified, whether it corresponds with the data previously written into the memory cell 1, etc.

If—in contrast to what is described above—it is determined, after performing the step G shown in FIG. 2 and the subsequent comparison between the current values of the loop count variable n and the variable maximum value $n_{max}$, that the current value of the loop count variable n is larger than the above variable maximum value $n_{max}$, it is assumed—according to FIG. 2 and the step I shown there—that the corresponding memory cell 1 is defective, i.e. not suitable for normal operation.

The memory cell 1 will—in future—then not be controlled any more (instead of this a redundant cell—activated during step I and functionally replacing the defective cell 1—will be).

If it is determined—as shown in FIG. 2—during the above step G, i.e. while using an integration time period of $t_{integration,standard} + m \times t_{guardband}$, that the data read out from memory cell 1 does not correspond with the data last written into the memory cell 1, the data value—in accordance with step K shown in FIG. 2—(and controlled by the central control device 2) as described below and written into the corresponding memory cell 1, is read out anew:

After an appropriate voltage has been applied to the electrodes 2a, 2b of the memory cell 1, the resulting current—flowing through the active material layer—is integrated, and in fact during an integration time period—which has again been increased in relation to step G—(namely by a time period lying m' times the "guardband time" $t_{guardband}$ above the standard integration time period ("standard integration time" $t_{integration,standard}$, (i.e. during a time period $t_{integration,standard} + m' \times t_{guardband}$, whereby the following applies: m'>m, in particular for instance m'=3)).

Depending on whether the value determined by the integration lies above or below the above, predetermined critical limit, it is assumed that the memory cell 1 was in a relatively strong conductive, or a relatively weak conductive state (i.e., that the memory cell 1 had a logic "one" or logic "zero" data bit written into it).

Then it is verified, whether the data—determined during step K and read out of the memory cell 1—corresponds with the data written into the memory cell during the previous write step 1.

If not, it is assumed—in accordance with FIG. 2 and the step L shown there—that the corresponding memory cell 1 is defective, i.e. not suitable for normal operation.

The memory cell 1 will—in future—then not be controlled any more (instead of this, a redundant cell—activated during step L and functionally replacing cell 1—will be).

In case the data determined during step K and read out of the memory cell 1 corresponds with the data written into the memory cell during the previous write step, the current value of the loop count variable n is—as illustrated in FIG. 2—compared (by the central control device 2) with the above predetermined variable maximum value $n_{max}$.

In case the current value of the loop count variable n is higher than the above variable maximum value $n_{max}$, it is assumed—according to FIG. 2 and the step L shown there—that the corresponding memory cell 1 is defective and therefore to be—functionally—replaced by a corresponding redundant cell 1.

If however the current value of the loop count variable n is smaller than or equal to the above variable maximum value $n_{max}$, the corresponding memory cell 1 again—in accordance with step M shown in FIG. 2 and corresponding with the above steps A, E and H (and controlled by the central control device 2)—has the corresponding data written into it (for instance—again—a logic "one" (or a logic "zero")).

This is done—with the use of standard write parameters—increased in relation with the previously used write parameters (i.e. the corresponding write pulse is longer, and/or higher, than the previously used write pulse).

This raising of the write parameters (in contrast with the above step H) is "global", i.e. it applies to all process steps used after the write pulse shown in FIG. 2 (and for future write actions on memory cell 1 (and—alternatively—for future write actions on the above further memory cells of the memory component))—assuming that the corresponding parameters would, as in accordance with the above illustration, be accordingly modified again in the course of the process step shown in FIG. 2.

Next, the data written into the memory cell 1 is again read out (in accordance with the above step B, and in particular by using an integration time period of $t_{integration,standard}-t_{guardband}$), and it is verified, whether this corresponds with data previously written into the memory cell 1, etc., etc., etc.

In the process described with reference to FIG. 2 for corresponding write actions (and with a correspondingly similar process for delete actions) the write (and delete) parameters can then be individually optimally adjusted for the corresponding memory cell—by means of iterative control of the current cell state in each case—in particular so that the memory cells 1 provided on the memory component contain—after a write (and/or delete) process (for instance containing the process steps shown in FIG. 2) and/or in a particular ("conductive", or "non-conductive") cell state—essentially identical pre-set resistances, determined by the targeted variation of the integration time during corresponding read processes.

Alternatively the optimizing and/or adjustment process parameters described below in reference to FIG. 3 can also be used (again illustrated as an example for optimizing and/or adjusting the write parameters; a corresponding process can also be used for optimizing and/or adjusting the delete parameters):

In a first step A'—controlled by the central control device 2—the corresponding memory cell 1 (or alternatively: numerous memory cells 1 together) can have corresponding data written into it (for instance a logic "one" (or a logic "zero") (i.e. brought—from a relatively less conductive state—to a relatively strong conductive state (or vice versa))).

The write parameters (duration and height of the write pulse) thereby used are adjusted to a relatively low standard (initial )value, so that an excessive "hard" writing of the memory cell 1 is avoided (i.e. the corresponding memory cell 1 is given a relatively "soft" write (a "standard soft write")).

Figure 3:
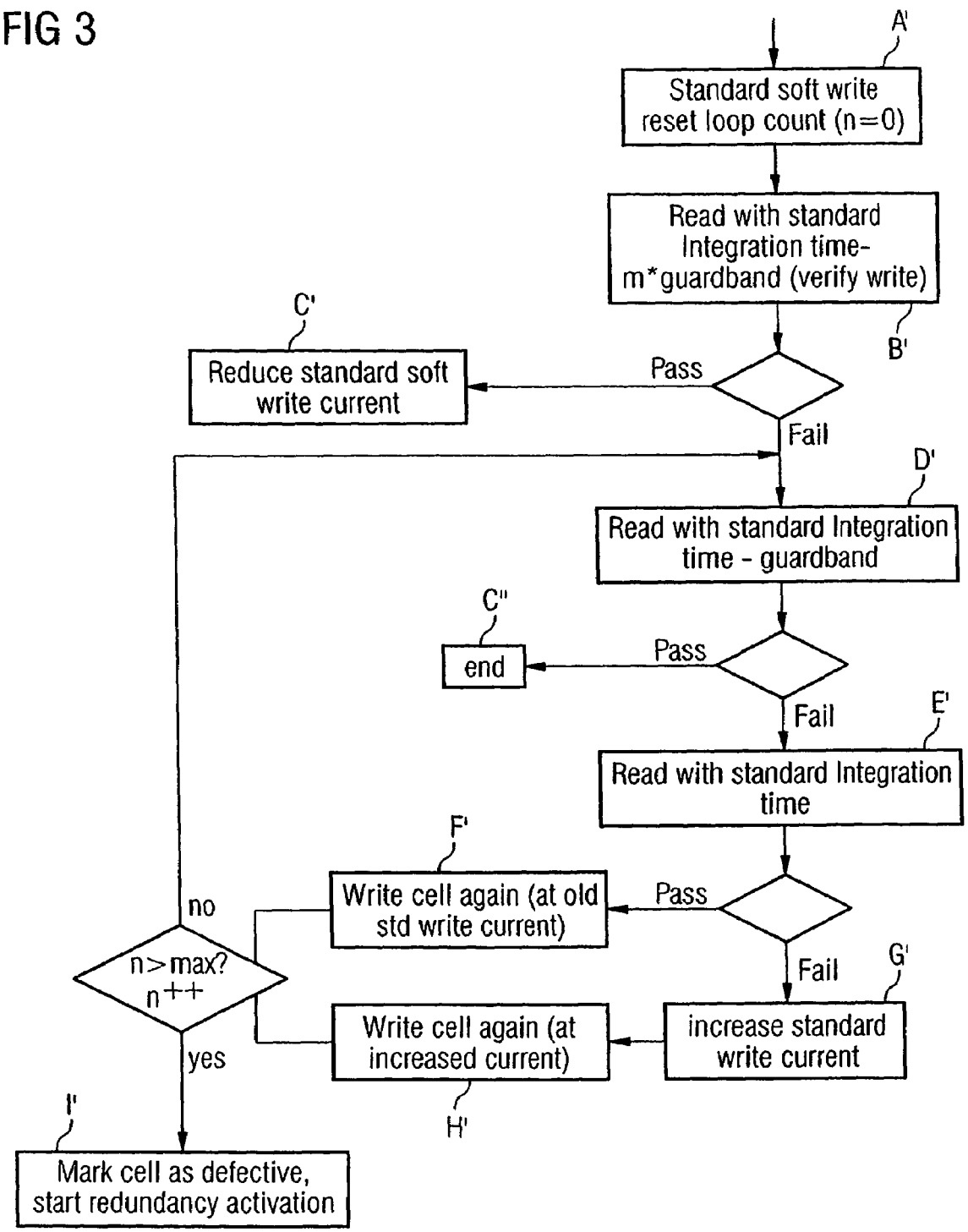
FIG. 3 shows a flow diagram to illustrate the write and/or delete process steps performed by a further alternative embodiment of the invention.

Furthermore—as also illustrated in FIG. 3—a loop count variable n is (re-)set to the value "zero".

Next—as illustrated in FIG. 3—during a step B', and controlled by the central control device 2 (in particular by an evaluation circuit provided there) the data value written into the corresponding memory cell 1 is read out.

To achieve this the central control device 2 (in particular the evaluation circuit) can apply a corresponding voltage to the electrodes 2a, 2b of the memory cell 1.

The resulting current—flowing through the active material layer 3—is integrated by the central control device 2 (in particular by the evaluation circuit) during a predetermined time period (and in fact not during the whole standard integration period ("standard integration time" $t_{integration,standard}$)—used during the normal operation of conventional memory cells—but—simply—during the standard integration period ("standard integration time" $t_{integration,standard}$), minus a figure of m times the "safety margin" (the "guardband time" $t_{guardband}$) (i.e. during a time period $t_{integration,standard}-m\times t_{guardband}$)), whereby the following applies: m>1, in particular for instance m=2)).

Depending on whether the value determined by the integration lies above or below a predetermined critical limit, it is assumed that the memory cell 1 was in a relatively strong conductive, or a relatively weak conductive state (i.e., that the memory cell 1 had a logic "one", or logic "zero" data bit written into it).

Then it is verified whether the data unit—determined during step B' and read out from the memory cell 1—corresponds with the data unit written into the memory cell 1 during step A'.

If "yes," the memory cell 1 is ready for a new action (write or delete action).

Furthermore—in terms of step C' shown in FIG. 3—the write parameters used for future write actions into the memory cell 1 (and where needed into the above further memory cells) are reduced, i.e. either regarding the duration and/or the height of the write pulses, so that during future write actions the memory cell 1 (and where needed also the above further memory cells) are then written less "hard" than before, due to the reduced standard write parameters (i.e. the reduced duration and/or height of the write pulses).

If it is determined during the step B' that the data read out does not correspond with the data written into the memory cell 1 during step A', the data value written into the corresponding memory cell 1 is—as illustrated in FIG. 3 and controlled by the central control device 2 (in particular by an evaluation circuit provided there)—again correspondingly read out during step D' as described below:

An appropriate voltage is again applied to the electrodes 2a, 2b of the memory cell 1 by the central control device 2 (in particular by the evaluation circuit).

The resulting current—flowing through the active material layer 3—is integrated by the central control device 2 (in particular by the evaluation circuit) during an integration time period—increased in relation to step B' (in fact during a time period again lying below the standard integration period ("standard integration time" $t_{integration,standard}$), for instance during the standard integration period ("standard integration time" $t_{integration,standard}$ minus the above safety margin (i.e. minus the "guardband time" $t_{guardband}$), i.e. during a time period $t_{integration,standard}-t_{guardband}$).

Depending on whether the value determined by the integration lies above or below a predetermined critical limit, it is assumed that the memory cell 1 was in a relatively strong conductive, or a relatively weak conductive state (i.e. that the memory cell 1 had a logic "one" or logic "zero" written into it).

Then it is verified whether the data—determined during step D' and read out of the memory cell 1—corresponds with the data previously written into the memory cell 1.

If "yes", the memory cell 1 is ready for a new (write or delete action) action (and the standard write parameters remain unchanged (cf. the step C'' shown in FIG. 3)).

If not, the data value written into the corresponding memory cell 1 is again correspondingly read out—as illustrated in FIG. 3—during a step E', and controlled by the central control device 2 (in particular by an evaluation circuit provided there) as described below:

An appropriate voltage is again applied to the electrodes 2a, 2b of the memory cell 1 by the central control device 2 (in particular by the evaluation circuit).

The resulting current—flowing through the active material layer 3—is integrated by the central control device 2 (in particular by the evaluation circuit), in fact during an integration time period further increased in relation to step D' (in other words during the above standard integration time period ("standard integration time" $t_{integration,standard}$)).

Depending on whether the value determined by the integration lies above or below the predetermined critical value, it is assumed that the memory cell 1 was in a relatively strong conductive or a relatively weak conductive state (i.e., that the memory cell 1 had a logic "one", or logic "zero" data bit written into it).

Then it is verified whether the data—determined during step E' and read out of the memory cell 1—corresponds with the data previously written into the memory cell 1.

If "yes"—in terms of the step F' shown in FIG. 3—(and without the data previously stored on the memory cell 1 being deleted) the corresponding memory cell 1 again has data corresponding with the previously written data written into it (for instance—in accordance with the previously performed write action—with a logic "one" (or a logic "zero")).

For this, the same write parameters as for the previously performed write action are used (i.e. a write pulse of correspondingly identical height and duration) and/or the above standard-write parameters.

The raising of the write parameters is "global", i.e. it applies to all subsequent write pulses used in the process steps shown in FIG. 3(and for subsequent write actions into the memory cell 1 (and—alternatively—for future write actions into the above further memory cells of the memory component))—on condition that the corresponding parameters are, corresponding to the above description, are again correspondingly changed during the process steps shown in FIG. 3.

Then—in accordance with step H' shown in FIG. 3—(without first deleting the data stored in the memory cell 1) the corresponding memory cell 1 again has data corresponding with the previously written data (for instance—corresponding with the previously performed write action—with a logic "one" (or a logic "zero")) written into it, and in fact by using the write parameters correspondingly increased during the above step G' (in particular the increased write current pulse as described above).

After performing the above step F', and/or of the step H'—alternatively executed as illustrated—the current value of the loop count variable n is compared (by the central control device 2) with a previously determined variable maximum value $n_{max}$ as illustrated in FIG. 3.

The variable maximum value $n_{max}$ may for instance amount to between 1 and 10; to following may for apply: $n_{max}=2$, or $n_{max}=3$, etc.

In case the current value of the loop count variable n is smaller than or equal to the above variable maximum value $n_{max}$, the value of the loop count variable n is—according to FIG. 3—for instance increased by one (n++).

Then—as illustrated in FIG. 3—the above step D' is again performed, i.e. by using the standard integration time period ("standard integration time" $t_{integration,standard}$) minus the "guardband time" ($t_{guardband}$) (i.e. the integration time period $t_{integration,standard}-t_{guardband}$)—the data value written into the corresponding memory cell 1 is again read out and it is verified, whether the data—determined during step D' and read out of the memory cell 1—corresponds with the data previously written into the memory cell 1, etc.

If it is determined—after performing step F', or alternatively step H'—that the current value of the loop count variable n is higher than the variable maximum value $n_{max}$, it is assumed—according to FIG. 3 and step I' illustrated there—that the corresponding memory cell 1 is defective.

The memory cell 1 will—in future—then not be controlled any more (instead of this, a redundant cell—activated during step I and functionally replacing the defective cell 1—will be).

REFERENCE NUMBERS

1 Memory cell
2 Central control device
2a Electrode
2b Electrode
3 Active material layer

What is claimed is:

1. A process for operating a plurality of memory cells, the memory cells each including an active material, comprising:
   (a) applying a write or delete pulse of a predetermined height to the active material of a first memory cell of the plurality of memory cells to establish a desired conductive state in the first memory cell;
   (b) evaluating a first conductive state of the first memory cell during a first time period;
   (c) reducing the predetermined pulse height if the first conductive state of the first memory cell corresponds to the desired conductive state;
   (d) applying a write or delete pulse having a reduced predetermined height to the active material of a second memory cell, if the first conductive state corresponds to the desired conductive state; and
   (e) evaluating a second conductive state of the first memory cell during a second time period, if the first conductive state does not correspond to the desired conductive state.

2. The process according to claim 1, wherein a resistance of the first memory cell is evaluated during step (b).

3. The process according to claim 1, wherein current flowing through the first memory cell is measured during step (b).

4. The process according to claim 3, wherein the current flowing through the first memory cell is integrated during the first time period during step (b).

5. The process according to claim 1, in which, an evaluated state of the first memory is cell a substantially conductive state.

6. The process according to claim 5, in which the conductive state of the first memory cell is changed into a substantially conductive state by using a pulse having a reduced predetermined height.

7. The process according to claim 6, in which the reduced predetermined height corresponds to the write or delete pulse.

8. The process according to claim 6, in which a duration of the write or delete pulse is modified.

9. A resistive switching memory component with a plurality of memory cells having an active material and a control device for performing a process, the process comprising:
(a) applying a write or delete pulse of a predetermined duration to a first memory cell of the plurality of memory cells to establish a desired conductive state in the first memory cell;
(b) evaluating a first conductive state of the first memory cell during a first time period;
(c) reducing the predetermined pulse duration if the first conductive state of the first memory cell corresponds to the desired conductive state;
(d) applying a write or delete pulse having a reduced predetermined duration to the active material of a second memory cell, if the first conductive state corresponds to the desired conductive state; and
(e) evaluating a second conductive state of the first memory cell during a second time period, if the first conductive state does not correspond to the desired conductive state.

10. A system, comprising:
a memory component, with a plurality of memory cells; and
a control device arranged externally to the memory component, the system performing a process comprising:
(a) applying a write or delete pulse of a predetermined height or a predetermined duration or both to a first memory cell to establish a desired conductive state in the first memory cell;
(b) evaluating a first conductive state of the first memory cell during a first time period;
(c) reducing the predetermined pulse height or predetermined duration or both if the first conductive state of the first memory cell corresponds to the desired conductive state;
(d) applying a write or delete pulse having a reduced predetermined height or reduced predetermined duration or both to an active material of a second memory cell, if the first conductive state corresponds to the desired conductive state; and
(e) evaluating a second conductive state of the first memory cell during a second time period, if the first conductive state does not correspond to the desired conductive state.

11. A process for operating a plurality of memory cells, each of the memory cells including an active material, comprising:
(a) applying a write or delete pulse of a predetermined height and/or a predetermined duration to the active material of a first memory cell to establish a desired conductive state in the first memory cell;
(b) evaluating a first conductive state of the first memory cell during a first time period;
(c) reducing or increasing the predetermined pulse height and/or the predetermined pulse duration if the first conductive state of the first memory cell corresponds to the desired conductive state;
(d) applying a write or delete pulse of the reduced or increased predetermined height and/or the reduced or increased predetermined duration to the active material of a second memory cell, if the first conductive state corresponds to the desired conductive state; and
(e) evaluating a second conductive state of the first memory cell during a second time period, if the first conductive state does not correspond to the desired conductive state.

12. A method for optimizing write parameters for a memory cell, comprising:
writing a first data value to the memory cell using a first set of write parameters;
reading a second data value from the memory cell by integrating current flowing from the memory cell during a first time period;
if the second data value corresponds to the first data value, then using a second set of write parameters for future write actions to the memory cell, wherein a write pulse duration or height or both in the second set of write parameters is less than a write pulse duration or height or both in the first set of write parameters; and
if the second data value does not correspond to the first data value, then reading a third data value from the memory cell by integrating current flowing from the memory cell during a second time period, wherein the second time period is longer than the first time period.

13. The method of claim 12, further comprising:
if the third data value corresponds to the first data value, then using the first set of write parameters to again write the first data value to the memory cell; and
if the third data value does not correspond to the first data value, then reading a fourth data value from the memory cell by integrating current flowing from the memory cell during a third time period, wherein the third time period is longer than both the first time period and the second time period.

14. The method of claim 13, further comprising:
if the fourth data value corresponds to the first data value, then writing the first data value to the memory cell using a third set of write parameters, wherein a write pulse duration or height or both in the third set of write parameters is more than a write pulse duration or height or both in the first set of write parameters; and
if the fourth data value does not correspond to the first data value, then reading a fifth data value from the memory cell by integrating current flowing from the memory cell during a fourth time period, wherein the fourth time period is longer than the first time period, the second time period and the third time period.

15. The method of claim 14, further comprising:
if the fifth data value corresponds to the first data value, then writing the first data value to the memory cell using a fourth set of write parameters wherein a write pulse duration or height or both in the fourth set of write parameters is more than a write pulse duration or height or both in the third set of write parameters; and
if the fifth data value does not correspond to the first data value, then marking the memory cell as defective.

16. The method of claim 13, further comprising:
monitoring a number of times that a read-out data value is compared to the first data value; and
marking the cell as defective if the number of times exceeds a predetermined value.

* * * * *